United States Patent [19]
Razeghi et al.

[11] Patent Number: 5,650,635
[45] Date of Patent: Jul. 22, 1997

[54] MULTIPLE STACKED SB-BASED HETEROSTRUCTURES

[75] Inventors: Manijeh Razeghi, Wilmette; Jozef F. Piotrowski, Evanston, both of Ill.

[73] Assignee: Northwestern University, Evanston, Ill.

[21] Appl. No.: 503,066

[22] Filed: Jul. 14, 1995

[51] Int. Cl.$^6$ .................................................. H01L 31/00
[52] U.S. Cl. ........................ 257/21; 257/22; 257/184; 257/201; 257/441; 257/443
[58] Field of Search ..................... 257/22, 201, 184, 257/185, 441, 103, 96, 97, 192, 197, 187, 21, 443

[56] References Cited

U.S. PATENT DOCUMENTS

| | | | |
|---|---|---|---|
| 3,364,084 | 1/1968 | Reuberwein | 148/175 |
| 4,207,122 | 6/1980 | Goodman | 148/33.4 |
| 4,368,098 | 1/1983 | Manasevit | 156/606 |
| 4,404,265 | 9/1983 | Manasevit | 428/689 |
| 4,607,272 | 8/1986 | Osbourn | 257/18 |
| 4,630,279 | 12/1986 | Kajimura et al. | 372/45 |
| 4,720,309 | 1/1988 | Deveaud et al. | 148/33.1 |
| 4,793,872 | 12/1988 | Meunier et al. | 148/33.4 |
| 4,874,438 | 10/1989 | Oshita et al. | 148/400 |
| 4,897,149 | 1/1990 | Suzuki et al. | 156/610 |
| 4,902,356 | 2/1990 | Noguchi et al. | 148/33.4 |
| 4,952,811 | 8/1990 | Elliott | 250/370.13 |
| 5,232,869 | 8/1993 | Frigo et al. | 437/133 |

OTHER PUBLICATIONS

Wickenden et al., *Growth of Epitaxial Layers of Gallium Nitride on Silicon Carbide and Corundum Substrates*, Journal of Crystal Growth 9, pp. 158–164 (1971).

Sugiyama et al., *Vapor Phase Epitaxial Growth and Characterization of $Ga_{1-z}In_yAs_{1-x}P_x$ Quarterly Alloys*, Japanese Journal of Applied Physics, pp. 2197–2203 (Dec., 1977).

Holmes & Kamath, *Growth Characteristics of LPE InSb and InGaSb*, Journal of Electronic Materials, vol. 9, pp. 95–111, (Nov. 1, 1980).

Noreika, Francombe & Wood, *Growth of Sb and InSb by Molecular–Beam Epitaxy*, Journal of Applied Physics 52(12), pp. 7416–7420, (Dec., 1981).

Wood, Noreika & Francombe, *Thallium Incorporation in Molecular–Beam–Epitaxial InSb*, Journal of Applied Physics 59(10), pp. 3610–3612 (May, 1986).

Williams et al., *Molecular–beam Epitaxy of (100) InSb for CdTe/InSb Device Applications*, Journal of Applied Physics 63(5), pp. 1526–1532 (Mar. 1, 1988).

Kurtz et al., *High Photoconductive Gain in Lateral InAsSb strained–Layer Superlattice Infrared Detectors*, Appl. Phys. Lett. 53(20), pp. 1960–1963 (Nov. 14, 1988).

Chyi et al., *Growth of InSb and $InSb_{1-x}Sb_x$ On GaAs By Molecular Beam Epitaxy*, Appl.Phys.Lett. pp. 1092–1094 (Sep. 19, 1988).

Williams et al., *Heteroepitaxial Growth of InSb on (100) GaAs Using Molecular Beam Epitaxy*, Appl.Phys.Lett. 53(13), pp. 1189–1191 (Sep. 26, 1988).

McConville et al., *Interfacial Studies and Electrical Characterization of Heteroepitaxial InSb On GaAs (100) Grown By MBE*, Journal of Crystal Growth 95, pp. 228–234 (1989).

Razeghi, *A Survey of GaInAsP–InP for Photonic and Electronic Applications*, vol. 1, The MOCVD Challenge, Chapters 1, 4 & 5 (1989).

(List continued on next page.)

*Primary Examiner*—William Mintel
*Attorney, Agent, or Firm*—Welsh & Katz, Ltd.

[57] ABSTRACT

The subject invention comprises a plurality of serially connected small volume photovoltaic devices. A single device includes a first layer of $n^+$ doped InSb, a second layer of doped $InAs_{1-x}Sb_x$ and a third layer of $p^+$ doped InSb. From 2–50 of these devices are grown by either a low-pressure MOCVD or MBE process to a maximum thickness of about 10 μm. Alternatively, the first layer may be $n^+$ doped $In_yGa_{1-y}$, Sb the second layer $p^+$ doped $InAs_{1-x}Sb_x$ and the third layer $In_yGa_{1-y}Sb$, repeated to a maximum thickness of 10 m.

10 Claims, 2 Drawing Sheets

OTHER PUBLICATIONS

Akasaki et al., *Effects of Ain Buffer Layer on Crystallographic Structure and on Electrical and Optical Properties of GaN and $Ga_{1-x}Al_xN$ Films Grown on Sapphire Substrate by Movpe*, Journal of Crystal Growth 98, pp. 209–219 (1988).

Chyi et al., *Molecular Beam Epitaxial Growth and Characterization of InSb on Si*, Appl.Phys. Lett. 54(11), pp. 1016–1018 (Mar. 13, 1989).

Davis & Thompson, *Molecular Beam Epitaxy Growth of InSb Films on GaAs*, Appl.Phys. Lett. 54(22), pp. 2235–2237 (May 29, 1989).

Oh et al., *Molecular Beam Epitaxial Growth of High–Quality InSb on InP and GaAs Substrates*, Journal of Applied Physics 66(8), pp. 3618–3621 (Oct. 15, 1989).

Ma et al., *Organometallic Vapor Phase Epitaxial Growth and Characterization of InAsBi and InAsSbBi*, Appl.Phys.Lett. 55(23), pp. 2424–2422 (Dec. 4, 1989).

Zhang et al., *A Transmission Electron Microscopy and Reflection High–Energy Electron Diffraction Study of the Initial Stages of the Heteroepitaxial Growth of InSb on GaAs (001) by Molecular Beam Epitaxy*, Journal of Applied Physics 67(2), pp. 800–806 (Jan. 15, 1990).

Oliveira et al., *A Generalized Model for the Reconstruction of (001) Surfaces of III–V Compound Semiconductors Based on a Rheed Study of InSb(001)*, Surface Science 227, pp. 150–156 (1990).

Chow et al., *Growth and Characterization of $InAs/Ga_{1-x}In_xSb$ Strained–Layer Superlattices*, Appl. Phys. Lett. 56(15), pp. 1418–1420 (Apr. 9, 1990).

Razeghi et al., *$Ga_{0.51}In_{0.49}P/Ga_xIn_{1-x}As$ Lattice–Matched ($x=1$) and Strained ($x=0.85$) Two–Dimensional Electron Gas Field–Effect Transistors*, Semicond. Sci. Technol. 6, pp. 103–107 (1991).

Biefeld & Hebner, *Growth of InSb on GaAs by Metalorganic Chemical Vapor Deposition*, Journal of Crystal Growth 109, pp. 272–278 (1991).

Gaskill et al., *High Mobility InSb Grown by Organometallic Vapor Phase Epitaxy*, Appl. Phys. Lett. 58(17), pp. 1905–1907 (Apr. 29, 1991).

Thompson et al., *Use of Atomic Layer Epitaxy Buffer for The Growth of InSb on GaAs by Molecular Beam Epitaxy*, Journal of Applied Physics 69(10), pp. 7166–7172 (May 15, 1991).

Garbuzov et al., *High–Power 0.8 µm InGaAsP–GaAs SCH SQW Lasers*, IEEE Journal of Quantum Electronics, vol. 27, No. 6 (Jun. 6, 1991).

Edgar, J.H., *Prospects for Device Implementation of Wide Band Gap Semiconductors*, J. Mater. Res., vol. 7, No. 1, pp. 235–252 (Jan. 1, 1992).

Chen et al., *Accurate Determination of Misfit Strain, Layer Thickness, and Critical Layer Thickness in Ultrathin Buried Strained InGaAs/GaAs Layer by X–Ray Diffraction*, J.Vac.Sci.Techno. B 10(2), pp. 769–770 (Mar./Apr., 1992).

Söderström et al., *Molecular Beam Epitaxy Growth and Characterization of InSb Layers on GaAs Substrates*, Semicond. Sci. Techno. 7, pp. 337–343 (1992).

Kuo et al., *Gas Source Molecular–Beam Epitaxial Growth of Normal Incidence GaAs/AlGaAs Quantum Well Infrared Photodetectors*, J. Vac. Sci. Techno. B 10(2), pp. 995–997 (Mar./Apr. 1992).

Ferguson et al., *RHEED Intensity Effects During the Growth of InAs, InSb and In(As, Sb) By Molecular Beam Epitaxy*, Journal of Crystal Growth 121, pp. 267–277 (1992).

Strite & Morkoc, *GaN, AlN, and InN: A Review*, J. Vac. Sci. Techno. B 10(4) pp. 1237–1248 (Jul./Aug. 1992).

Chung & Gershenzon, *The Influence of Oxygen on the Electrical and Optical Properties of GaN Crystals Grown By Metalorganic Vapor Phase Epitaxy*, Journal of Applied Physics 72(2), pp. 651–659 (Jul. 15, 1992).

Levine et al., *Photoexcited Escape Probability, Optical GaIn, and Noise in Quantum Well Infrared Photodetectors*, Journal of Applied Physics 72(9), pp. 4429–4443 (Nov. 1, 1992).

Lee et al., *Characterization of Molecular Beam Epitaxially Grown InSb Layers and Diode Structures*, Solid–State Electronics, vol. 36, No. 3, pp. 387–389, (1993).

Li et al., *Molecular–Beam Epitaxial Growth of InSb on GaAs and Si for Infrared Detector Applications*, J. Vac. Sci. Techno. 11(3), pp. 872–874 (May/Jun. 1993).

Choi et al., *High Quality InSb Growth on GaAs and Si By Low Pressure Metalorganic Chemical Vapor Deposition*, Mat. Res. Soc. Symp. Proc. vol. 281, pp. 375–380 (1993).

Schilfgaarde et al., *InTlSb: An Infrared Detector Material?*, Appl. Phys. Lett. 62(16), pp. 1857–1859 (Apr. 19, 1993).

Besikci et al., *Anomalous Hall Effect in InSb Layers Grown By Metal Organic Chemical Vapor Deposition on GaAs Substrates*, Journal of Applied Physics 73(10), pp. 5009–5013 (May 15, 1993).

Choi et al., *Growth of $In_{1-x}Tl_xSb$, A New Infrared Material, By Low–Pressure Metalorganic Chemical Vapor Deposition*, Appl. Phys. Lett. 63(3), pp. 361–363 (Jul. 19, 1993).

Razeghi et al., *$In_{1-x}Tl_xSb$ for Long Wavelength Infrared Photodetectors (Invited Talk)*, Electrochemical Society, Inc. 184 Meeting Program, 3 pages (Oct. 10–15, 1993).

Partin et al., *Growth of High Mobility InSb by Metalorganic Chemical Vapor Deposition*, Journal of Electronic Materials, vol. 23, No. 2 (Jun. 11, 1993).

Staveteig et al., *Photoconductance Measurements on InTlSb/InSb/GaAs Grown by Low–Pressure Metalorganic Chemical Vapor Deposition*, pp. 460–462 (Jan. 24, 1994).

Choi et al., *Characterization of InTlSb/InSb Grown by Low–Pressure Metal–Organic Chemical Vapor deposition On a GaAs Substrate*, Journal of Applied Physics 75(6), vol. 75, No. 6 (Mar. 15, 1994).

Diaz et al., *Efficiency of Photoluminescence and Excess Carrier Confinement in InGaAsP/GaAs Structures Prepared by Metalorganic Chemical–Vapor Deposition*, Journal of Applied Physics 76(2), pp. 700–704 (Jul. 15, 1994).

Besikci & Razeghi, *Electron Transport Properties of $Ga_{0.51}In_{0.49}P$ for Device Applications*, IEEE Transaction on Electron Devices, vol. 4, No. 6, pp. 1066–1069 (Jun., 1994).

Diaz et al., *High–Power InGaAsP/GaAs 0.8 µm Laser Diodes and Peculiarities of Operational Characteristics*, Appl. Phys. Lett. 65(8), pp. 1004–1005 (Aug. 22, 1994).

Brown et al., *Intersubband Hold Absorption in GaAs–GaInP Quantum Wells Grown By Gas Source Molecular Beam Epitaxy*, Appl. Phys. Lett. 65(9), pp. 1130–1132 (Aug. 29, 1994).

Kiernan, *ARPA Seeks Cheaper, Better Laser Weapons*, Laser Focus World, p. 53 (Jul., 1994).

Mitchel et al., *Interface Roughness Scattering in Thin, Undoped GaInP/GaAs Quantum Wells*, Appl. Phys. Lett. 65(12), pp. 1578–1580, (Sep. 19, 1994).

Besikci & Razeghi, *On the Description of the Collision Terms in Three–Valley Hydrodynamic Models for GaAs Device Modeling*, IEEE Transactions on Electron Devices, vol. 42, No. 8, pp. 1471–1475 (Aug. 8, 1994).

Jungbluth, *Aluminum–Free High–Power Diodes Have Long Lifetimes*, Laser Focus World, pp. 26–27 (Aug. 26, 1994).

Diaz et al., *Theoretical Investigations of Minority Carrier Leakages of High–Power 0.8 µm InGaAsP/InGaP/GaAs Laser Diodes*, Appl. Phys. Lett. 65(18), pp. 2260–2262 (Oct. 31, 1994).

*InGaAsP Laser Diodes Outperform AlGaAs*, Opto & Laser Europe, Issue 14, pp. 37–38 (Oct., 1994).

Michel et al., *Molecular Beam Epitaxial Growth of High Quality InSb*, Appl. Phys. Lett. 65(26), pp. 3338–3340 (Dec. 26, 1994).

Elhamri et al., *Persistent Photoconductivity in Thin Undoped GaInP/GaAs Quantum Wells*, Appl. Phys. Lett. 66(2), pp. 171–173 (Jan. 16, 1995).

Dobbelaere et al., *Growth and Optical Characterization of $InAs_{1-x}Sb_x$ on GaAs and on GaAs–Coated Si By Molecular Beam Epitaxy*, Appl. Phys. Lett. 55, pp. 1856–1858 (1989).

Razeghi, *High–Power Laser Diodes Based on InGaAsP Alloys*, Nature, vol. 369, pp. 631–633 (Jun. 23, 1994).

Diaz et al., *InGaP/InGaAsP/GaAs 0.808µm Separate Confinement Laser Diodes Grown by Metalorganic Chemical Vapor Deposition*, IEEE Photonics Technology Letters, vol. 6, No. 2, pp. 132–134 (Feb., 1994).

Besinkci & Razeghi, *Electron Transport Properties of $Ga_{0.51}In_{0.49}P$ for Device Applications*, IEEE Transactions on Electron Devices, vol. 41, No. 6, pp. 1066–1069 (Jun., 1994).

Diaz et al., *Theoretical Investigation of Minority Carrier Leakages of High–Power 0.8µm InGaAsP/InGaP/GaAs Laser Diodes*, Appl. Phys. Lett. 65(18), pp. 2260–2262 (Oct. 31, 1994).

Diaz et al., *High–Power InGaP/InGaAsP/GaAs 0.8 µm Laser Diodes and Peculiarities of Operational Characteristics*, Appl. Phys. Lett. 65(8), pp. 1004–1005 (Aug. 22, 1994).

Brown & Hegde, *Intersubband Hole Absorption in GaAs–GaInP Quantum Wells Grown By Gas Source Molecular Beam Epitaxy*, Appl. Phys. Lett. 65(9), pp. 1130–1132 (Aug. 29, 1994).

Singh et al., *Molecular–beam epitaxial growth of high quality InSb for p–i–n photodetectors*, J. Vac. Sci. Technol. B 13(2) (Mar./Apr. 1995).

Choi et al., *$In_{1-x}Tl_xSb$ for Long–Wavelength Infrared Phorodetectors (Invited Paper)*, Electrochemical Society, Inc. Proceedings vol. 94–5.

Michel et al., *Molecular beam epitaxial growth of InSb p–i–n photodetectors on GaAs and Si*, The International Society for Optical Engineering Proceedings vol. 2397 (Feb. 6–9, 1995).

Razeghi et al., *Exploration of entire range of III–V semiconductors and their device applications*, Materials Science and Technology vol. 11 (Jan., 1995).

Kim et al., *8–13 µm InAsSb heterojunction photodiode operating at near room temperature*, Appl. Phys. Lett 67 (18) (Oct. 30, 1995).

MULTIPLE STACKED SB-BASED HETEROSTRUCTURES

This invention is made with government support under Grants N00014-93-0931 and N00014-92-3-1951 awarded by the Department of the Navy. The government has certain rights in the invention.

FIELD OF THE INVENTION

This application relates to Sb-based semiconductor heterostructures for use in photodetectors and more particularly series connected Sb-based semiconductor heterostructures with reduced dark current and increased resistance for use at room temperature.

BACKGROUND OF THE INVENTION

I. PHOTODETECTORS

Unselective thermal detectors such as radiation thermocouples, bolometers and pyroelectric detectors are operated mainly at ambient temperature and can be used in an extremely wide range of electromagnetic spectrum, from x-rays to microwaves. Uncooled thermal detectors are lightweight, rugged, reliable and convenient to use. However, their detectivity is relatively low, especially when operated at high frequencies. They are used in applications which do not require high performance or fast response. The response time of thermal detectors is adequate for some imaging applications, while the wide spectral band and large number of elements can compensate for modest performance.

There are numerous applications such as fast imaging, laser receivers, real time spectroscopy and fast pyrometry, which do require high performance and fast response as well. A high sensitivity and fast response detection of infrared radiation can be achieved with the use of semiconductor photodetectors.

The major drawback of current IR photodetectors is the need for cooling to suppress thermal processes which compete with the optical ones in the generation of free carriers in a semiconductor. The capability to operate with background-limited sensitivity (BLIP) is considered the ultimate performance goal. Generally, cryogenic cooling is required to achieve this ideal situation. The cooling requirements of intrinsic narrow band gap semiconductor photodetectors are much less stringent than that of extrinsic devices, Schottky barrier and quantum well devices. Typically, to obtain background-limited performance, detectors for the 3–5 μm spectral region are operated at 200 K or less, while those for the 8–14 μm region are typically operated at liquid nitrogen temperature (77 K).

The conventional liquid nitrogen cooling technique is inconvenient in industry and field use. One alternative is to use Joule-Thompson microcoolers to change high-pressure nitrogen gas into a liquid directly at the cold finger of the dewar. Unfortunately, this cooling system requires a high-pressure gas tank or compressor. Another alternative is the Stirling-cycle cooler. No liquid or gas cryogen is required, only electrical power. The Stirling-cycle cooler is quite bulky, expensive and still unreliable.

The need for cooling is a considerable problem which inhibits the widespread use of IR systems. The cooling requirements add considerably to the cost, bulk, weight, power consumption and inconvenience of infrared systems and it is highly desirable that they be eliminated or reduced.

II. PHOTOCONDUCTORS

Photoconductivity is still the most common mode of operation of a 3–5 μm and 8–14 μ $Hg_{1-x}Cd_xTe$ photodetectors. Recent advances in material preparation and detector technology have led to devices approaching theoretical limits of responsivity over wide ranges of temperatures and background. The simple n-type $Hg_{1-x}Cd_xTe$ photoconductor operated at liquid nitrogen temperature is a mature product that has been in production for many years. The performance of near room temperature photodetectors has been further improved by the use of monolithic optical immersion, heterojunction contacts, 3D heterostructure design and non-equilibrium operation.

Generally, the present high-temperature photoconductors have relatively poor low-frequency properties, exhibiting a high level of 1/f noise with a knee of about 10 kHz or more. The 1/f noise is a critical issue. The problem is especially stringent in uncooled and longest wavelength devices, which require a high biasing for best performance.

However, the measured detectivity of uncooled 10.6 μm photoconductors at high frequencies is several orders of magnitude higher compared to other ambient temperature 10.6 μm detectors with subnanosecond response time such as photon drag detectors, fast thermocouples, bolometers and pyroelectric ones, approaching the performance of slow thermal detectors.

In contrast to photoconductors, photovoltaic detectors can operate without bias which enable good performance at low frequencies. Most of the previous work has been done using $Hg_{1-x}Cd_xTe$.

The development of photodiodes was stimulated initially by their application as high-speed detectors, mostly for direct and heterodyne detection of 10.6 μm $CO_2$ laser radiation, but present efforts have been dominated by applications for large arrays for LWIR and MWIR thermal imaging systems. In contrast to photodetectors, photodiodes with their very low power dissipation can be assembled in two-dimensional arrays containing a very large ($\approx 10^6$) number of elements.

SUMMARY OF THE INVENTION

The subject invention comprises a plurality of serially connected small volume photovoltaic devices. A single device includes a first layer of heavily doped $n^+$ InSb, a second layer of lighter $p^+$ doped $In_{1-x}As_xSb$ and a third layer of heavily doped InSb. From 2–50 of these devices are grown by either a low-pressure MOCVD or MBE process to a maximum thickness of about 10 μm.

Single-element photodiodes can be fabricated from the heterostructures of the subject invention using wet chemical etching and standard photolithographic techniques. Lactic-nitric acid mixtures provide a controllable etching rate. Metallization is realized using electron-beam evaporated TiAu layers. Annealing is not necessary because of the heavy doping used in the contact layers. The mesa top is fully metallized in order to decrease series resistance and increase quantum efficiency by optical double-pass. In a first stage, cleaved chips are mounted on standard laser heat-sinks with drilled hole for backside illumination. Optical immersion is achieved by using either refractive or Fresnel lenses prepared in the substrate. Refractive lenses can be prepared by mechanical grinding followed by chemical polishing. Fresnel lenses are prepared using multistage photolithography followed by ion-beam etching.

For three-dimensional heterostructures, the fabrication sequence is as follows: First, an $n^+$InSb/π-InAsSb heterostructure as grown on a semi-insulating GaAs substrate. Second, mesas are etched down to the $p^+$-InSb contact layer. Third, a wider gap lightly doped semiconductor (e.g.

GaInSb) is regrown for lateral carrier confinement. Fourth, following removal of the mask, the n⁺-InSb top contact layer is grown.

DESCRIPTION OF THE PREFERRED EMBODIMENTS

Figure 1:
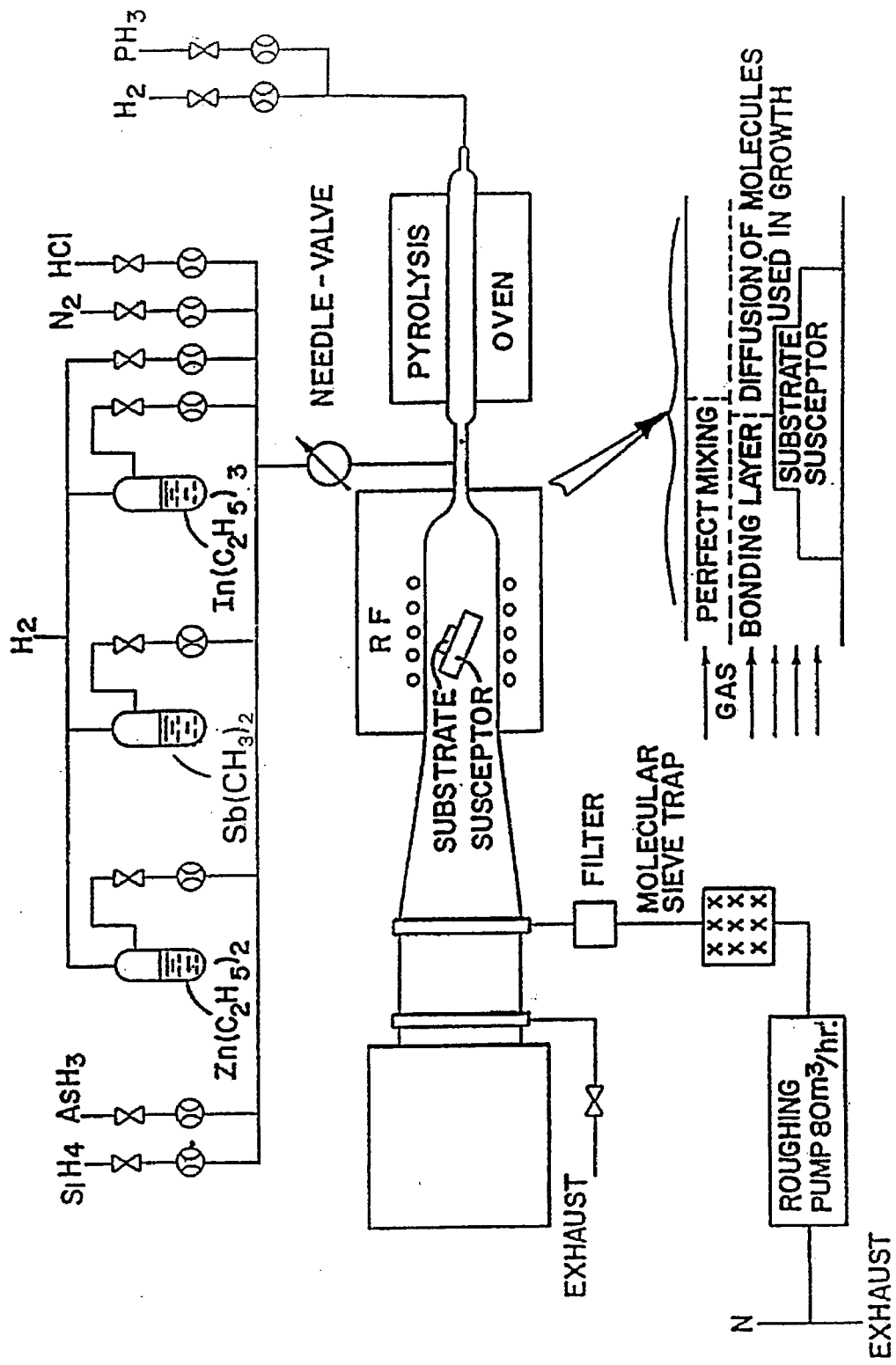
FIG. 1 is a schematic diagram of the LP-MOCVD reactor for use in the method of the subject invention.

The reactor and associated gas-distribution scheme used herein is shown in FIG. 1. The system includes a cooled quartz reaction tube (diameter 5 cm in the substrate area) pumped by a high-capacity roughing pump (120 hr$^{-1}$) to a vacuum between 10 and 300 Torr. The substrate was mounted on a pyrolytically coated graphite susceptor that was heated by rf induction at 1 MHz. The pressure inside the reactor was measured by a mechanical gauge and the temperature by an infrared pyrometer. A molecular sieve was used to impede oil back-diffusion at the input of the pump. The working pressure was adjusted by varying the flow rate of the pump by using a control gate valve. The gas panel was classical, using ¼-inch stainless steel tubes and Swagelock fittings. Flow rates were controlled by mass flowmeters.

The reactor was purged with a nitrogen flow of 4 liters min$^{-1}$, and the working pressure of 75 Torr was established by opening the gate valve that separated the pump and the reactor. The evacuation line that was used at atmospheric pressure was automatically closed by the opening of the gate valve. The gas flow rates were measured under standard conditions, i.e., 1 atm and 20° C., even when the reactor was at subatmospheric pressure. The pressure in the gas panel was regulated by the needle valve placed between the gas panel and the reactor. The needle valve was adjusted to maintain a constant pressure of 1 atm on the gas panel, thereby ensuring reproducibility of flow-rate measurements.

Examples of the gas sources used in this study for the growth of InAsSb and InGaSb and doping sources are listed in the accompanying tabulation.

| | | |
|---|---|---|
| Sb(CH$_3$)$_3$ | AsH$_3$ | Sn(CH$_3$)$_4$ |
| In(CH$_3$)$_3$ | Be(CH$_3$)$_2$ | (C$_5$H$_5$)$_5$MG |
| Ga(C$_2$H$_5$)$_3$ | S$_2$H$_4$ | |

The organometallic group-III species trimethyl indium (TMI) and methyl antimony (TMA) are contained in stainless steel bubblers, which are held in controlled temperature baths at 31° and 0° C., respectively. An accurately metered flow of purified H$_2$ for TMI and TMA is passed through the appropriate bubbler. To ensure that the source material remains in vapor form, the saturated vapor that emerges from the bottle is immediately diluted by a flow of hydrogen. The mole fraction, and thus the partial pressure, of the source species is lower in the mixture and is prevented from condensing in the stainless steel pipe work.

Semi-insulating or n⁺ substrates are supplied by MCP, Crystacomm, Metals Research, or Sumitomo in the form of ingots or polished wafers. Wafers are sliced 2° off (100) toward (110) and chemically etched for 10 seconds at room temperature in a 15% bromine-methanol solution in order to remove 20 μm from each side. The wafers were then mechanochemically polished in a solution of 1.5% bromine in methanol, removing a further 80–100 μm. The substrates were finally cleaned in methanol and rinsed in isopropyl alcohol. The substrates were etched again, just before use, by dipping in 1% bromine in methanol at room temperature for one minute, rinsing in warm isopropyl alcohol, and drying. An n⁺ tin-doped substrate and a semi-insulating iron-doped substrate were generally used for each experiment.

The epitaxial layer quality is sensitive to the pretreatment of the substrate and the alloy composition.

Pretreatment of the substrates prior to epitaxial growth was thus found to be beneficial. One such pretreatment procedure is as follows:

1. Dipping in H$_2$SO$_4$ for 3 minutes with ultrasonic agitation;
2. Rinsing in Deionized H$_2$O;
3. Rinsing in hot methanol;
4. Dipping in 3% Br in methanol at room temperature for 3 minutes (ultrasonic bath);
5. Rinsing in hot methanol;
6. Dipping in H$_2$SO$_4$ for 3 minutes;
7. Rinsing in deionized H$_2$O, and
8. Rinsing in hot methanol.

After this treatment, it is possible to preserve the substrate for one or two weeks without repeating this treatment prior to growth.

Growth takes place by introducing metered amounts of the group-III alkyls and the group-V hydrides into a quartz reaction tube containing a substrate placed on an rf-heated susceptor surface. The hot susceptor has a catalytic effect on the decomposition of the gaseous products; the growth rate is proportional to the flow rate of the group-III species but is independent of temperature between 500° and 600° C. and of the partial pressure of group-V species as well. The gas molecules diffuse across the boundary layer to the substrate surface, where the metal alkyls and hydrides decompose to produce the group-III and group-V elemental species. The elemental species move on the hot surface until they find an available lattice site, where growth then occurs. They are contained in stainless steel bubblers, which are held in controlled temperature baths at 31° and 0° C., respectively. An accurately metered flow of purified H$_2$ for TMI and TEG is passed through the appropriate bubbler. To ensure that the source material remains in vapor form, the saturated vapor that emerges from the bottle is immediately diluted by a flow of hydrogen. The mole fraction, and thus the partial pressure, of the source species is lower in the mixture and is prevented from condensing in the stainless steel pipe work.

Molecular Beam Epitaxy (MBE) and low-pressure Metalorganic Chemical Vapor Deposition (MOCVD) are used to grow the Sb-based heterostructures of the subject invention. The growth is performed using readily available, high quality and low cost substrates, such as GaAs, and GaAs-coated silicon.

The practical near room temperature photodetectors with optimum performance require narrow gap π absorber layers and heavily doped wider gap n⁺ and p⁺ contact layers (n⁺πp⁺ structures). In addition, the devices can be supplied with optical concentrators which can be prepared on the substrate. These optical concentrators are either refractive lenses or binary (e.g. Fresnel) lenses. The realization of lateral carrier confinement with wider bandgap semiconductors require either selective epitaxy and/or regrowth. The material growth requirements for the successful realization of detector arrays of the subject invention are the ability to grow high quality narrow-bandgap heterostructures with tight composition and doping control on foreign substrates such as GaAs and GaAs-coated Si and the ability to perform selective epitaxy and/or regrowth.

More specifically, the doping requirements for $n^+ \pi p^+$ Sb-based heterostructures are the following: The doping of the narrow bandgap active layer should be in the range of $10^{15}$ to $3\times 10^{17}$ cm$^{-3}$. Moreover, the bandgap of this absorber material should be optimized for operation at any specific wavelength (8–14 μm) and temperature (200–300 K). The doping of the degenerate $n^+$ contact materials should be in the range of $10^{17}$ to $10^{20}$ cm$^{-3}$ and the bandgap should be wider than that for the absorber region, and the doping of the wider gap $p^+$ contact material should be in the range of $10^{17}$ to $10^{20}$ cm$^{-3}$.

P-type doping may be achieved using Zn or Mg with MOCVD. Doping source temperatures, flows or fluxes will be adjusted to cover the doping range required for the contact layers.

Another possible candidate material for the contact layer ($n^+$ and $p^+$) is $In_{1-y}Ga_ySb$. By alloying InSb with Ga, it is possible to increase the heterojunction barrier heights and improve carrier confinement, while maintaining identical lattice parameters.

In the method of the subject invention an $InAs_{1-x}Sb_x$ layer will be grown on top of the InSb buffer layer deposited on GaAs or GaAs-coated Si substrates and $n^+$ doped. $In_{1-y}Ga_ySb$ could be used on an InAsSb buffer layer as an alternative, with a lattice parameter matched to that of $InAs_{1-x}Sb_x$ (x=y=0.65–1.0).

The subject invention includes a multiple stack of $n^+\pi p^+$ Sb-based heterostructures. The total thickness of such multijunction devices should be kept between about 5 and about 10 μm: In the case of single junction devices, the thickness of the absorber region is determined by the ambipolar diffusion length (a few micrometers). In the case of multijunction devices, the thickness of each individual absorber should be kept well below diffusion length, while the total absorber thickness should be close to the effective absorption length. This means that the proposed MOCVD and MBE growth techniques are the most appropriate for the realization of such structures requiring a large number of relatively thin layers for a total thickness on the order of a few microns.

Figure 2:
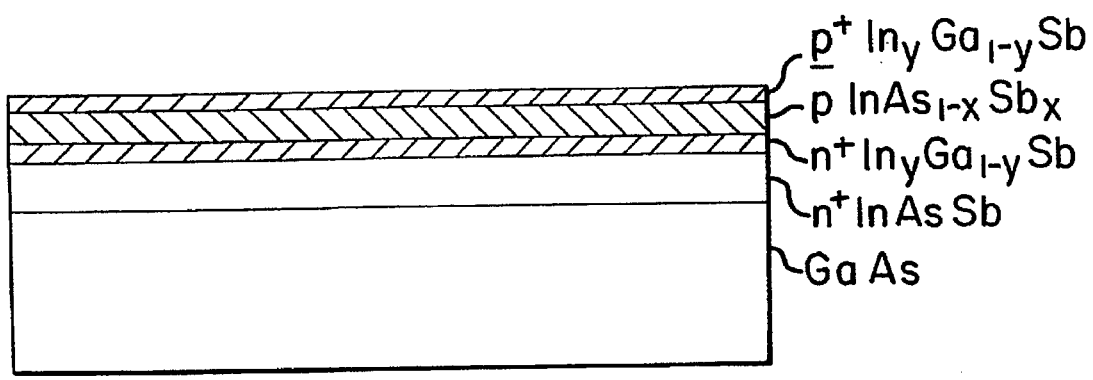
FIG. 2 is a cross-section of an InSb/InAsSb/InSb heterostructure for a photodetector operating at room temperature with an epitaxial layer structure on a GaAs substrate.

Referring now to FIG. 2, there is shown one iteration of the device of the subject invention having a Gallium Arsenide substrate on which is grown a layer of InSb, with a further layer of InAsSb and a layer of InSb grown on top of that. Generally speaking, multiple stacks of these Sb-based heterostructures will be grown. Each such heterostructure will be approximately 0.1–0.7 μm with approximately 2–50 repetitions, up to a maximum of about 10 μm. The total thickness of the structure should be lower than the inverse of the absorption coefficient of radiation, i.e.

$$\frac{1}{\alpha}.$$

Each heterostructure layer is grown and then doped as follows. The first InSb layer is optimally 0.1 μm and doped at 10–20 atoms cm$^{-3}$, n-type. This layer may be between 0.05 and 1.5 μm and doped between $10^{18}$ and $10^{20}$ atoms cm$^{-3}$ concentration.

The next layer, InAsSb, is optimally 0.5 μm and doped $2\times 10^{16}$, p-type. The thickness may be anywhere from 1 micron to 5 microns, while the doping concentration may be within the range of $1–5\times 10^{16}$ atoms cm$^{-3}$.

The top layer of InSb is optimally 0.1 μm with p-type doping of $10^{19}$ cm$^{-3}$. The thickness of this top layer may be between 0.05 to 0.15 μm with a doping level of $10^{18}$ to $10^{20}$ cm$^{-3}$ p-type.

It is important that the lattice matches of the various layers be as close as possible. Thus, InGaSb is an acceptable alternative to InSb, both having ideal lattice matches with InAsSb.

The following examples illustrate the subject invention:

EXAMPLE 1

| | MOCVD Grown Structure | | |
|---|---|---|---|
| Layer | (μm) Thickness | (atms)/cm$^{-3}$ Level Doping | Doping Element |
| InSb | 0.1 | $10^{19}$ | Sn |
| InAsSb | 0.5 | $2 \times 10^{16}$ | Zn |
| InSb | 0.1 | $10^{20}$ | Zn |

The above structure was repeated 15 times using MOCVD growth. Good structural quality and composition of the ternary layers were observed using high resolution x-ray diffraction. Photovoltaic response was demonstrated up to 12 μm at 200° K and up to 14 μm at room temperature.

EXAMPLE 2

| | MBE Grown Structure | | |
|---|---|---|---|
| Layer | (μm) Thickness | (atms)/cm$^{-3}$ Level Doping | Doping Element |
| InSb | .05 | $10^{19}$ | Si |
| $In_{0.8}As_{.2}Sb$ | .25 | $10^{16}$ | Be |
| InSb | .05 | $10^{19}$ | Be |

32 layers of the above heterostructure are prepared utilizing MBE procedures, p-type layer being doped to the concentration indicated with Bis(cyclopentadienyl) magnesium. Similar characteristics as set forth above in Example 1 are observed.

EXAMPLE 3

| | | MBE Grown Structure | | |
|---|---|---|---|---|
| LAYER | | μm THICKNESS | (atms/cm$^{-3}$) DOPING | DOPING ELEMENT | |
| 1 InAsSb | 1.0 | ≈$10^{19}$ | Si | Buffer Layer |
| 2 $In_{.65}Ga_{.35}Sb$ | 0.2 | ≈$10^{18}$ | Si | |
| 3 $InAs_{.35}Sb_{.65}$ | 0.2 | $2 \times 10^{16}$ | Be | |
| 4 $In_{.65}Ga_{.35}Sb$ | 0.2 | ≈$10^{18}$ | Be | |

Layers 2, 3 and 4 of the above heterostructure are grown six successive times to achieve characteristics similar to those observed in Example 1.

EXAMPLE 4

| | MOCVD Grown Structure | | |
|---|---|---|---|
| LAYER | μm THICKNESS | (atms/cm$^{-3}$) DOPING | DOPING EFFECT |
| 1 InAsSb | 1.0 | ≈$10^{19}$ | Sn |
| 2 $In_{.65}Ga_{.35}Sb$ | 0.2 | ≈$10^{18}$ | Sn |
| 3 $InAs_{.35}Sb_{.65}$ | 0.2 | ≈$2 \times 10^{16}$ | Mg |
| 4 $In_{.65}Ga_{.35}Sb$ | 0.2 | ≈$10^{18}$ | Mg |

Layers 2, 3 and 4 of the above heterostructure are grown six successive times to achieve characteristics similar to those observed in Example 1.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments and equivalents falling within the scope of the appended claims.

Various features of the invention are set forth in the following claims.

What is claimed is:

1. An Sb-based heterostructure comprising:

a plurality of vertically stacked heterostructures on a substrate, each said heterostructure comprising a first layer of InS, a second layer of the composition $InAs_{1-x}Sb_x$ (x=0.65–1.0) and a third layer of InSb, said first layer being doped with Sn, said second and third layers being doped with an element selected from the group consisting of Zn and Mg, said vertically stacked heterostructures being a total of less than about 10 µm thick in the vertical dimension.

2. The heterostructure of claim 1 wherein said first and third layers of InSb are doped to a concentration of from $10^-$–$10^{20}$ atoms cm$^{-3}$.

3. The heterostructure of claim 1 wherein the second layer is doped to a level of from $1\times10^{16}$–$5\times10^{16}$ atoms cm$^{-3}$.

4. The heterostructure of claim 1 wherein said first and third layers of InSb are doped to a concentration of from $10^{18}$ to $10^{-20}$ atoms cm$^{-3}$.

5. The heterostructure of claim 1 wherein there are from 2–50 of said stacks of heterostructures.

6. An Sb-based heterostructure comprising:

a plurality of vertically stacked heterostructures on a substrate, each heterostructure comprising a first layer of InSb, a second layer of the composition $InAs_{1-x}Sb_x$ (x=0.65–1.0) and a third layer of InSb, said first layer being doped with an element selected from the group of Sn and Si, said second and third layers being doped with an element selected from Zn, Mg and Be;

said plurality of heterostructures being a total of less than about 10 µm thick in the vertical direction.

7. An Sb-based heterostructure comprising:

a plurality of vertically stacked heterostructures on a substrate, a buffer layer of InAsSb on said substrate, each heterostructure comprising a first layer of $In_yGa_{1-y}Sb$ (y=0.65–1.0).

a second layer of the composition $InAs_{1-x}Sb_x$ (x=0.65–1.0) and a third layer of $In_yGa_{1-y}Sb$, said first layer being doped with an element selected from the group consisting of Sn and Si, said second and third layers being doped with an element selected from the group consisting of Zn, Mg and Be, said vertically stacked heterostructures being a total of less than about 10 µm thick in the vertical dimension.

8. The heterostructure of claim 7 wherein said first and third layers of $In_yGa_{1-y}Sb$ are doped to a concentration of from $10^{19}$–$10^{20}$ atoms cm$^{-3}$.

9. The heterostructure of claim 7 wherein said second layer of $InAs_{1-x}Sb_x$ is doped to a concentration of from $10^{16}$–$2\times10^{16}$ atoms cm$^{-3}$.

10. The heterostructure of claim 7 where x=0.8.

* * * * *